United States Patent [19]
Touchy

[11] B 3,925,121
[45] Dec. 9, 1975

[54] PRODUCTION OF SEMICONDUCTIVE MONOCRYSTALS OF GROUP III-V SEMICONDUCTOR COMPOUNDS

[75] Inventor: Wolfgang Touchy, Munich, Germany

[73] Assignee: Siemens Aktiengesellschaft, Berlin & Munich, Germany

[22] Filed: Mar. 8, 1973

[21] Appl. No.: 339,218

[44] Published under the Trial Voluntary Protest Program on January 28, 1975 as document no. B 339,218.

[30] Foreign Application Priority Data

Mar. 23, 1972 Germany .......................... 2214224

[52] U.S. Cl. ................ 148/189; 148/187; 148/191; 252/62.3 GA; 357/30
[51] Int. Cl.$^2$ ............................................ H01L 7/44
[58] Field of Search ........... 148/189, 187, 190, 191, 148/188; 252/62.3 GA

[56] References Cited

UNITED STATES PATENTS

| | | | |
|---|---|---|---|
| 3,245,847 | 4/1966 | Pizzarello | 148/189 X |
| 3,255,056 | 6/1966 | Flatley et al. | 148/191 X |
| 3,298,879 | 1/1967 | Scott et al. | 148/187 |
| 3,408,238 | 10/1968 | Sanders | 148/190 X |
| 3,422,322 | 1/1969 | Haisty | 148/190 X |
| 3,502,518 | 3/1970 | Antell | 148/190 X |
| 3,537,921 | 11/1970 | Boland | 148/189 X |
| 3,660,156 | 5/1972 | Schmidt | 148/189 X |
| 3,660,178 | 5/1972 | Takahashi et al. | 148/189 |

*Primary Examiner*—G. Ozaki
*Attorney, Agent, or Firm*—Hill, Gross, Simpson, Van Santen, Steadman, Chiara & Simpson

[57] ABSTRACT

Semiconductor monocrystals composed of Group III-V compounds such as GaAs having a p-conductive layer therein are produced by masking a surface of a Group III-V monocrystal with a protective layer composed of a material, such as silicon dioxide which allows Group III elements to diffuse through the layer while preventing diffusion of Group V elements, subjecting the masked monocrystal to a heat treatment in a gaseous atmosphere so as to remove some of the Group III atoms from the monocrystal and then doping the treated monocrystal with an element of Group II, such as Zn.

8 Claims, No Drawings

PRODUCTION OF SEMICONDUCTIVE MONOCRYSTALS OF GROUP III-V SEMICONDUCTOR COMPOUNDS

BACKGROUND OF THE INVENTION

1. Field of the Invention

The invention relates to monocrystal semiconductors and more particularly to production of Group III-V semiconductor monocrystals having a p-conductive layer therein for use as electro-luminescent semiconductor components.

2. Prior Art

Electro-luminescent semiconductor components, such as LEDs (light emitting diodes), coupling elements and the like require a p-n junction in the crystal of the semiconductor material.

It is known to produce p-n junctions for luminescent diodes in semiconductor crystals which have been doped with elements having donor properties, such as sulphur, selenium or tellurium by the subsequent diffusion of zinc and/or cadmium atoms into the crystal. However, diodes produced in this manner are unsuited for prolonged operations, since they have been operating for a period of several thousand hours, a drop in power of more than half of the original value of the emitting radiation may take place.

It is known that acceptor atoms located at interstitial positions in a crystal travel under the influence of their own radiation and cause a non-radiating recombination so that the electrical properties of semiconductor components containing such atoms vary constantly. This disadvantage can be overcome, as disclosed by me in German Offenlegungsschrift 2,010,745, by pulling an n-conductive gallium arsenide monocrystal under an increased arsenic vapor pressure. The resultant gallium arsenide monocrystal has a higher arsenic content than the stoichiometric composition and has gallium vacancies in the crystalline structure. A subsequent diffusion of acceptor atoms thus takes place primarily via the gallium vacancies and not via the interstitial positions. However, the known process for producing gallium arsenide monocrystals having an excess of arsenic are extremly economical, particularly when monocrystals of large diameter are desired.

SUMMARY OF THE INVENTION

The invention provides a method of treating Group III-V semiconductor monocrystals so as to render them useful as electro-luminescent semiconductor components whereby the semiconductor material is doped with a Group II element so that the atoms thereof are incorporated at gallium vacancies of the monocrystal.

It is a novel feature of the invention to produce a Group III-V semiconductor compound monocrystal having a p-conductive layer therein by masking the surface of a semiconductor compound monocrystal, such as composed of binary, tertiary or quarternary Group III-V compounds, for example GaAs, (GaAl)As, or [(GaAl)(AsP)] with a protective layer composed of a material that allows elements of Group III to diffuse therethrough upon heating the monocrystal, while preventing elements of Group V from diffusing from the monocrystal, such as a material selected from the group consisting of silicon dioxide, aluminum oxide and mixtures thereof; heat-treating the masked semiconductor monocrystal in a suitable gaseous atmosphere, such as composed of a mixture of nitrogen and hydrogen, at a temperature sufficient for Group III elements to diffuse from the monocrystal and through the protective layer, such as in the range of about 500° to 1,000°C for about 1 to 5 hours and then doping the so-treated monocrystal with a Group II element, such as zinc.

DESCRIPTION OF THE PREFERRED EMBODIMENTS

The invention provides an economic process for producing Group III-V semiconductor compound monocrystals having a p-conductive layer therein whereby some of the Group III element atoms within a Group III-V compound monocrystal are replaced with Group II element atoms.

In accordance with the principles of the invention, the process generally comprises covering or masking the surface of a Group III-V semiconductor compound monocrystal with a protective layer such that the elements of the third group of the Periodic System within the semiconductor compound are able to diffuse through the protective layer upon heating of the monocrystal, heating the monocrystal in a gaseous atmosphere under time-temperature conditions enabling a portion of the Group III element to diffuse from the monocrystal through the protective layer and then doping the so-treated monocrystal with an element of the second group of the Periodic System.

The semiconductor material that are processed in accordance with the principles of the invention to produce electro-luminescent components are selected from monocrystals of binary Group III-V semiconductor compounds, such as gallium arsenide (GaAs), gallium nitride (GaN), and boron phosphide (BP) and from monocrystals of tertiary or quaternary semiconductor compounds, such as gallium aluminum arsenide [(GaAl)As], gallium arsenide phosphide [Ga(AsP)], indium gallium phosphide [(InGa)P], indium aluminum phosphide [(InAl)P], aluminum gallium phosphide [(AlGa)P], gallium indium arsenide [(GaIn)As], indium aluminum arsenide [(InAl)As], gallium aluminum arsenide phosphide [(GaAl)(AsP)], and/or gallium aluminum nitride phosphide [(GaAl)(NP)].

The protective layer utilized in the practice of the invention may be of any of the conventional masking layers utilized in semiconductor technology. However, the protective layer selected must allow Group III elements to diffuse through it while stopping Group V elements.

In an exemplary embodiment, a protective layer composed of silicon dioxide and having a thickness in the range of about 500 to 1500A has been found to be particularly effective. However, a protective layer may also be formed of aluminum oxide, silicon nitride, phosphorus pentoxide or a mixture thereof, such as of silicon dioxide and phosphorus pentoxide, in a thickness adapted to the permeability of the individual elements. For a given layer thickness, protective layers composed of silicon dioxide diffusion doped with zinc atoms are most permeable; next in permeability are protective layers composed of silicon dioxide, then those composed of phosphorus pentoxide, aluminum oxide and silicon nitride.

The time-temperature for heat treatment conditions for out-diffusion of Group III element atoms from the masked monocrystals include temperatures in the range of about 500° to 1,000°C and time periods ranging from about 1 to 5 hours.

The Group II element utilized to dope the heat-treated semiconductor crystal is preferably selected from the group consisting of cadmium, magnesium, zinc and mixtures thereof.

An exemplary embodiment of the invention will now be described in somewhat more detail to illustrate further the principles of the invention.

A gallium arsenide wafer is prepared, such as by treatment with a suitable polishing agent and a protective layer of silicon dioxide is applied over the entire surface thereof. The protective layer may be applied in various ways, sputtering processes, both reactive sputtering and high frequency sputtering are particularly useful, also pyrolysis processes involving the decomposition of, for example, silicon hydrides or organic silicon compounds are also useful. The coated semiconductor wafer is then heated at a temperature of about 700° to 900°C in a gas atmosphere, such as one consisting of 80 percent by volume hydrogen and 20 percent by nitrogen. During the heat treatment, which preferably lasts for about two hours, gallium atoms diffuse out of the crystal and through the silicon dioxide layer. However, arsenic atoms are stopped from leaving the crystal by the protective layer.

The so-treated semiconductor wafer is then doped with a Group II element, for example zinc in accordance with various doping techniques. A diffusion source utilized in an in-diffusion process may be elemental zinc in an atmosphere containing arsenic or be zinc arsenide, again in an atmosphere containing arsenic, or be a liquid alloy of zinc. Further, it is also possible to utilize a paint-on or spin-on process, with a mixture of organic zinc and organic silicon compounds as the diffusion source.

The out-diffusion of, for example gallium atoms and the in-diffusion of, for example zinc atoms can be effected simultaneously, if desired. With simultaneously in and out diffusion of this type, a semiconductor wafer is coated with a protective layer and placed in an ampule containing vaporized zinc arsenide and subjected to the heat treatment outlined above.

As is apparent from the foregoing specification, the present invention is suceptible of being embodied with various alterations and modifications which may differ particularly from those that have been described in the preceeding specification and description. For this reason, it is to be fully understood that all of the foregoing is intended to be merely illustrative and is not to be construed or interpreted as being restrictive or otherwise limiting of the present invention, excepting as set forth and defined in the hereto-appendant claims.

I claim:

1. A method of producing a semiconductor monocrystal composed of Group III-V compounds and having a p-conductive layer therein, comprising the steps of;

covering the surface of a monocrystal composed of a Group III-V compound with a protective layer composed of a material that allows Group III elements to diffuse therethrough and selected from the group consisting of silicon dioxide, aluminum oxide and mixtures thereof;

sealing the coated semiconductor monocrystal in an ampule containing a Group II element diffusion source and a gaseous atmosphere composed of about 80% by volume of hydrogen and about 20% by volume nitrogen; and subjecting the coated semiconductor monocrystal to time-temperature conditions comprising heating the coated monocrystal at a temperature in the range of about 500° to 1,000° C. for a period of time ranging from about 1 to 5 hours whereby the Group III element of the Group III-V compound diffuses out of the monocrystal through the protective layer and the Group II element diffuses into the monocrystal through the protective layer.

2. A method as defined in claim 1 wherein the semiconductor monocrystal is composed of a Group III-V compound selected from the group consisting of (GaAs), (GaN), (BP), [(GaAl)As], [Ga(AsP)], [(InGa)P], [(InAl)P], [(AlGa)P], [(GaIn)As], [(InAl)As], [(GaAl)(AsP)] and [(GaAl)(NP)].

3. A method as defined in claim 1 wherein the Group II element utilized to dope the treated monocrystal is selected from the group consisting of cadmium, magnesium, zinc and mixtures thereof.

4. A method as defined in claim 1 wherein the treated monocrystal is doped with zinc.

5. A method as defined in claim 4 wherein the zinc is obtained from a diffusion source selected from the group consisting of elemental zinc in an atmosphere containing arsenic, zinc arsenide in an atmosphere containing arsenic, a liquid alloy of zinc, and a mixture of organic zinc compounds and organic silicon compounds.

6. A method as defined in claim 1 wherein the semiconductor monocrystal is composed of gallium arsenide, the protective layer is composed of silicon dioxide and the time-temperature conditions comprise heating said monocrystal at a temperature in the range of about 700° to 900°C for a period of time ranging from about 1 to 2 hours.

7. A method of producing a semiconductor monocrystal composed of gallium arsenide having a p-n conductive layer therein, comprising the steps of;

covering the surface of a gallium arsenide wafer with a layer of silicon dioxide having a thickness of about 500 to 1,500 A;

placing a zinc diffusion source adjacent to the coated wafer and sealing the space about said diffusion source and coated wafer; and subjecting the sealed space to a heat treatment including temperatures in the range of about 700° C. to 900° C. for a period of time ranging from about 1 to 5 hours;

whereby at least some of the gallium of the wafer diffuses out of said wafer through the silicon dioxide layer and at least some of the zinc diffuses into said wafer through the silicon dioxide layer.

8. A method as defined in claim 7 wherein the coated wafer is placed in an ampule containing vaporized zinc and arsenic prior to being subjected to the heat-treatment and then subjecting the coated wafer to said heat-treatment for substantially simultaneous out-diffusion of gallium from said wafer and in-diffusion of zinc into said wafer.

* * * * *